United States Patent [19]
Jonas et al.

[11] Patent Number: 6,083,635
[45] Date of Patent: Jul. 4, 2000

[54] CONDUCTIVE COATINGS

[75] Inventors: Friedrich Jonas, Aachen; Alexander Karbach, Krefeld, both of Germany; Bavo Muys, Mortsel; Etienne van Thillo, Essen, both of Belgium; Rolf Wehrmann, Krefeld, Germany; Andreas Elschner, Mülheim, Germany; Ralf Dujardin, Willich, Germany

[73] Assignee: Bayer AG, Germany

[21] Appl. No.: 09/044,742

[22] Filed: Mar. 19, 1998

Related U.S. Application Data

[62] Division of application No. 08/856,042, May 14, 1997, Pat. No. 5,766,515, which is a continuation of application No. 08/429,324, Apr. 26, 1995, abandoned.

[30] Foreign Application Priority Data

| May 6, 1994 | [DE] | Germany | 44 16 117 |
| May 6, 1994 | [DE] | Germany | 44 16 117 |
| Mar. 3, 1995 | [DE] | Germany | 195 07 413 |

[51] Int. Cl.$^7$ .............. H01B 1/00; H05B 33/14
[52] U.S. Cl. ........... 428/690; 428/917; 252/500; 528/373; 313/503; 313/504; 427/66
[58] Field of Search ............ 428/690, 691, 428/917; 252/500; 528/373, 377, 378; 313/503, 504; 427/66

[56] References Cited

U.S. PATENT DOCUMENTS

| 4,888,243 | 12/1989 | Jonas et al. | 428/411.1 |
| 4,959,430 | 9/1990 | Jonas et al. | 526/257 |
| 4,987,042 | 1/1991 | Jonas et al. | 429/213 |
| 5,035,926 | 7/1991 | Jonas et al. | 427/393.1 |
| 5,154,769 | 10/1992 | Kuske et al. | 106/459 |
| 5,164,005 | 11/1992 | Kuske et al. | 106/459 |
| 5,286,414 | 2/1994 | Kampf et al. | 252/500 |
| 5,294,372 | 3/1994 | Kochem et al. | 252/500 |
| 5,300,575 | 4/1994 | Jonas et al. | 525/186 |
| 5,370,825 | 12/1994 | Angelopoulos et al. | 252/500 |
| 5,370,981 | 12/1994 | Krafft et al. | 430/529 |
| 5,447,824 | 9/1995 | Mutsaers et al. | 430/315 |
| 5,482,655 | 1/1996 | Vogel et al. | 252/500 |

FOREIGN PATENT DOCUMENTS

| 302304 | 2/1989 | European Pat. Off. . |
| 339340 | 11/1989 | European Pat. Off. . |
| 416 570 | 3/1991 | European Pat. Off. . |
| 440957 | 8/1991 | European Pat. Off. . |
| 440958 | 8/1991 | European Pat. Off. . |
| 564911 | 10/1993 | European Pat. Off. . |
| 42 11 451 | 10/1993 | Germany . |
| 42 11 459 | 10/1993 | Germany . |
| 62 165 287 | 1/1989 | Japan . |
| 2-238846 | 7/1991 | Japan . |
| 5-145265 | 3/1994 | Japan . |
| WO 93 19 722 | 10/1993 | WIPO . |

*Primary Examiner*—Charles Nold
*Attorney, Agent, or Firm*—Connolly & Hutz

[57] ABSTRACT

Mixtures of

A) neutral polythiophenes of formula (I),

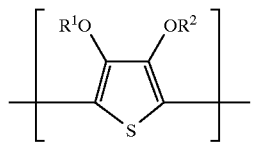

wherein $R_1$ and $R_2$ separately from one another represent hydrogen or a $C_{1-4}$ alkyl group or together form an optionally substituted $C_{1-4}$ alkylene radical, preferably a methylene radical optionally substituted by alkyl groups, an ethylene-1,2 radical optionally substituted by $C_{1-12}$ alkyl or phenyl groups, or a cyclohexylene-1,2 radical, and B) organic compounds containing dihydroxy or polyhydroxy and/or carboxyl groups or amide groups or lactam groups, as well as transparent, electrically conducting coatings made therefrom and electroluminescent systems containing a conductive layer produced from the abovementioned mixtures as the electrode.

20 Claims, No Drawings

CONDUCTIVE COATINGS

RELATED APPLICATIONS

This application is a divisional of application Ser. No. 08/856,042, filed on May 14, 1997, now U.S. Pat. No. 5,766,515 which in turn is a continuation application of application Ser. No. 08/429,324, filed on Apr. 26, 1995, now abandoned.

BACKGROUND OF THE INVENTION

1. Field of the Invention

In the field of electronics there is a requirement for electrically conductive, transparent electrodes, for example, for LCD displays.

2. Description of the Prior Art

Up to the present in most cases glasses or plastic sheets vapour-deposited with metal oxides are employed for these applications. Materials vapour-deposited or sputtered with ITO (indium tin oxide) have particularly good properties. The surface resistance of the ITO layers is of the order of magnitude of less than 500 Ω/□.

The production of such layers by sputtering under vacuum is very costly. There is therefore a need for a material which renders possible the production by simple application techniques of transparent coatings having good conductivity.

The production of conductive coatings based on organic conductive materials is known in principle. Thus for example coatings made of polypyrrole (EP-A 302 304) or of polythiophene derivatives (EP-A 440 957) have been described. These coatings can be produced using simple coating processes but they are not sufficiently conductive or transparent for many fields of application.

SUMMARY OF THE INVENTION

The present invention provides mixtures of

A) neutral polythiophenes of the recurring structural unit of the formula I,

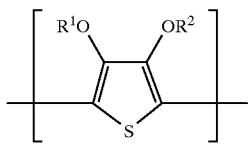

wherein
R$_1$ and R$_2$ independently of one another represent hydrogen or a C$_{1-4}$ alkyl group or together form an optionally substituted C$_{1-4}$ alkylene radical, preferably a methylene radical which is optionally substituted by alkyl groups, an ethylene-1,2 radical optionally substituted by C$_{1-12}$ alkyl or phenyl groups, or a cyclohexylene-1,2 radical, and B) organic compounds containing dihydroxy or polyhydroxy and/or carboxyl groups or amide groups or lactam groups.

These mixtures can be applied in thin layers to the substrate and by drying and annealing can be converted into transparent and electrically conducting layers.

Suitable organic compounds containing dihydroxy or polyhydroxy and/or carboxyl groups or amide groups correspond to formula (II)

wherein
n and m independently of one another denote an integer from 1 to 20, preferably from 2 to 8 and
R denotes a linear, branched or cyclic alkylene radical having 2 to 20 C atoms or an optionally substituted arylene radical having 6 to 14 C atoms or a heterocyclic radical having 4 to 10 C atoms or a sugar radical or sugar alcohol radical and
X denotes —OH or —NYZ, wherein Y, Z independently of one another represent hydrogen or alkyl, preferably hydrogen or C$_1$–C$_{12}$-alkyl.

DESCRIPTION OF THE PREFERRED EMBODIMENTS

Examples of suitable organic compounds containing lactam groups are N-methylpyrrolidone, pyrrolidone, caprolactam, N-methylcaprolactam, N-octylpyrrolidone.

Preferred radicals R are derived from the furan structure or the pyran structure.

Particularly preferred organic compounds B) are:
sugar and sugar derivatives such as sucrose, glucose, fructose, lactose; sugar alcohols such as sorbitol, mannitol; furan derivatives such as 2-furancarboxylic acid, 3-furancarboxylic acid; alcohols such as ethylene glycol, glycerol, di- or triethylene glycol.

In addition to water, other protic solvents can also be used as solvents for the polythiophene dispersions according to the invention, such as for example lower alcohols such as methanol, ethanol and isopropanol, as well as mixtures of water with lower alcohols and other water-miscible organic solvents, such as acetone.

The average particle diameters of the particles in the dispersion can be up to 10 μm, preferably up to 3 μm and most preferably up to 1 μm.

The polythiophenes of the recurring structural unit of the formula (I) are known (cf. EPA 440,957 and 339,340). The preparation of the dispersions or solutions according to the invention is described in EPA 440,957 and DE-OS 42 11 459.

The polythiophenes are preferably used in the dispersion or solution in a cationic form, i.e. in the form in which they are obtained for example by treating the neutral thiophenes with oxidising agents. Known oxidising agents, such as potassium peroxodisulphate are used for the oxidation. As a result of oxidation the polythiophenes acquire positive charges which are not shown in the formulae, since the number thereof and their positions cannot be accurately determined.

The number of recurring structural units of the formula (I) is generally >5.

The polythiophene dispersions or solutions according to the invention contain, based on the sum of polythiophene cations and polyanions, that is, based on the total solids content of the solution, from 1 to 100,000% by weight, preferably 10 to 1,000% by weight, of the compounds of formula (II) containing hydroxy and carboxyl groups. Preferably compounds of formula (II) which are soluble in water are employed.

Organic, polymeric binders and/or organic, low-molecular cross-linking agents may also be added to the coating solutions according to the invention. Appropriate binders are described, for example, in EP-A 564 911.

Epoxysilanes, of the kind described in EP-A 564 911, can be added to the coating solutions according to the invention, particularly for the production of adhesive layers on glass.

The coatings according to the invention can be produced by known methods, for example, by spraying, application by a doctor blade, dipping, application with roller applicator systems, by printing processes such as gravure printing, silk screen printing, curtain casting, and can be dried at room temperature or at temperatures of up to 300° C., preferably up to 200° C.

The coatings according to the invention can be annealed in order to increase electrical conductivity. Annealing can follow drying at temperatures of below 100° C. and can be combined with drying at temperatures of above 100° C. This annealing is carried out at temperatures of from 100° C. to 400° C., preferably at temperatures of up to 250° C. The duration of the annealing is between 0.5 and 3600 seconds, and preferably 1 and 90 seconds.

The thickness of the coatings according to the invention, depending on the intended use and requirements as to transparency and conductivity, is from 0.025 to 250 $\mu$m, preferably from 0.05 to 10 $\mu$m; the surface resistance is generally from 0.1 to 2000 $\Omega/\square$, preferably from 1 to 300 $\Omega/\square$.

The coatings according to the invention are used in areas which require good electrical conductivities, for example, as electrodes in electroluminescent displays, in LCD displays, in solid electrolyte capacitors, for the deposition of metals such as copper, nickel, for example, in the manufacture of printed circuits, in solar cells, in electrochromic displays or for the screening of electromagnetic radiation or for leading away electrical charges, for example, in picture tubes or as anticorrosive coatings on metals, for the production of touch screens. Other areas of application are systems for picture production, for example, silver halide photography, dry-plate systems, electrophotography.

The conductive layers can optionally be coated with further layers, for example, UV-curing coatings or organic or inorganic scratch-resistant coatings.

The layers according to the invention can be applied to organic and inorganic substrates. Examples of suitable inorganic substrates are glass, oxides or oxidic or non-oxidic ceramics such as aluminium oxide, silicon nitride. Examples of suitable organic substrates are sheets or other mouldings of pure organic polymers, copolymers or mixtures of, for example, polycarbonate, polystyrene, polyacrylates, polyesters such as polyethylene terephthalate, polybutylene terephthalate, polyethylene naphthalate, polyamides, polyimides, optionally glass-fibre reinforced epoxy resins, cellulose derivatives such as cellulose triacetate, polyolefins such as polyethylene, polypropylene.

The invention also relates to electroluminescent systems which contain the polythiophene dispersions according to the invention in the form of a transparent conductive layer or electrode.

The electroluminescent systems according to the invention consist of an upper and a lower electrode, between which an electroluminescent layer and optionally other auxiliary layers, such as for example charge-injecting layers are inserted, and they are characterised in that they contain as the electrode a conductive layer consisting of the polythiophene mixtures according to the invention.

The electroluminescent system can contain one or more electrodes, the conductive layers of which contain the abovementioned polythiophene dispersions. The conductive layers are preferably transparent.

The conductive layer can be integrated in various positions in the structure of the electroluminescent systems. The conductive layer can be applied for example in the form of a transparent conductive electrode between a transparent substrate and an electroluminescent layer.

For this purpose the mixtures according to the invention are applied in the form of a film to a suitable substrate in the systems according to the invention.

Suitable substrates are transparent substrates such as glass or plastic films (e.g. polyesters, such as polyethylene terephthalate or polyethylene naphthalate, polycarbonate, polyacrylate, polysulphone or polyimide film).

The polythiophene mixture according to the invention is distributed evenly on the substrate by techniques such as spin-coating, casting, application by a doctor blade, printing, curtain casting, etc.

After the film has dried the substrate thus coated can be subjected to a temperature of 150–250° C. for at least 1 sec, generally 30 secs. This annealing step increases the conductivity of the layer.

The thickness of the transparent conductive electrode is 5 nm to several Wm, preferably 10 nm to 1500 nm.

An electroluminescent layer is applied to this conductive transparent electrode in the form of a thin film. The substances described for example in EP-A 443,861 can be used as electroluminescent substances.

After the EL layer has dried it is coated with a counter-electrode. This consists of a conductive substance which can be transparent. Preferably metals such as Al, Au, Ag etc. or alloys or oxides thereof are suitable, which are applied by techniques such as vapour deposition, sputtering or platinisation.

The system according to the invention is brought into contact with the two electrodes by two electrical supply leads (such as for example metal wires).

When direct voltage in the range of 2 to 100 volt is applied the systems emit light of a wavelength of 400 to 700 nm. They display photoluminescence in the range from 400 to 700 nm.

The electroluminescent layer can contain one or more electrooptically active substances. It also optionally contains customary additives such as inert binders, charge-carrier-transporting substances and mixtures of inert binders and charge-carrier-transporting substances. Charge-carrier-transporting substances increase the electroluminescent intensity and reduce the inception voltages.

Suitable inert binders are preferably soluble, transparent polymers, such as for example polycarbonates, polystyrene and copolymers of polystyrene such as SAN, polysulphones, polyacrylates, polyvinylcarbazole, and vinyl acetate and vinyl alcohol polymers and copolymers, etc.

One or more intermediate layers can be additionally arranged between the electroluminescent systems and the electrodes. These intermediate layers—charge-carrier-transporting substances—are known (for example from Appl. Phys. Lett. 57 (1990)531) and are defined therein as HTL (hole transport layer) and ETL (electron transport layer).

The conductive layers can also be applied as transparent conductive electrodes to form a covering layer on an electroluminescent layer.

Contrary to the arrangement described above, in which the mixture according to the invention is arranged between an electroluminescent layer and a transparent substrate, the substance according to the invention can also be used as a covering electrode.

In this use the electroluminescent substance is arranged on a conductive or conductively coated substrate, such as for example metal plates or metal coatings applied by vapour deposition. The substance according to the invention is applied to the electroluminescent layer in the manner described above.

The advantage of this structure is that it also allows electroluminescent layers which are exposed to high temperatures during their production to be provided with a readily applicable, transparent, conductive electrode. Example: luminescent plates produced from a luminescent enamel based on ZnS.

The mixtures according to the invention can also be used as a charge-transporting intermediate layer in polymeric luminescent diodes. This intermediate layer increases the efficiency of the systems.

The mixture according to the invention is applied in the abovementioned manner in the form of an intermediate layer. The intermediate layer can be arranged:

between the transparent conductive electrode and the electroluminescent polymeric layer, between the electroluminescent polymeric layer and the covering electrode.

The thickness of the intermediate layer is about 3–200 nm, and generally between 10–100 nm, and most preferably about 10 nm.

EXAMPLES

A) Preparation of a 3,4-polyethylene Dioxythiophene Solution 20 g of free polystyrene sulphonic acid (Mn approx. 40,000), 13.0 g of potassium peroxydisulphate and 50 mg of iron(III) sulphate are stirred together in 2000 ml of water. 5.6 g of 3,4-ethylene dioxythiophene is added with stirring. The solution is stirred for 24 h at room temperature. Then 100 g of an anion exchanger (commercial product from Bayer AG, Lewatit MP 62) and 100 g of a cation exchanger (commercial product from Bayer AG, Lewatit S 100), both moistened by water, are added and stirred for 8 hours.

The ion exchangers are removed by filtration. A solution having a solids content of approximately 1.2% by weight is obtained, which is ready for use.

Example 1

10.0 g of the solution prepared in Example A) together with 10 g of isopropanol are mixed with each of the quantities of sorbitol and 3-glycidoxypropyltrimethoxysilane (commercial product A 187 Union Carbide) given in the Table. The mixture is applied to glass plates and dried in air (approx. 400 mg/m² dry).

The surface resistance of the dried layers is determined. The coated glass plates are then placed for 90 seconds on a hot plate at a temperature of 200° C. and the surface resistance is again determined after cooling.

TABLE

| A 187 | Sorbitol | Surface resistance [Ω/□] | |
|---|---|---|---|
| [g] | [g] | before | after annealing |
| 0.2 | — | 3500 | 3500 |
| 0.1 | 0.2 | 3400 | 120 |
| 0.2 | 0.2 | 3500 | 180 |
| 0.4 | 0.2 | 3300 | 300 |
| 0.1 | 0.6 | 4000 | 90 |
| 0.2 | 0.6 | 3800 | 105 |
| 0.4 | 0.6 | 3950 | 125 |

It is apparent from the Table that the process according to the invention results in significantly superior conductive coatings than does the 3,4-polyethylene dioxythiophene solution without additives and annealing.

Example 2

An Electroluminescent System

B) Preparation of the Coating Solution 3.0 g of sorbitol are dissolved with stirring in 50 g of solution A. Then 50 g of isopropanol are added dropwise with stirring and 0.5 g of glycidoxypropyl trimethoxysilane (A 187=a trade product of Union Carbide) is added.

C) Preparation of the 3,4-polyethylenedioxythiophene Electrode

Solution B is applied to a glass slide (20×30 mm²). The substrate is then rotated in a coating centrifuge for 10 seconds at 500 r.p.m. The substrate coated with the film is placed on a heating plate of a temperature of 180° C. for 60 seconds, during which the surface resistance is reduced to 80 Ω/□. The layer thickness of the film is 1.3 μm. The film is transparent in the visible region of the spectrum.

The electroluminescent polymer is then applied to this layer.

D) Application of an Electroluminescent Layer to the 3,4-polyethylenedioxythiophene Electrode The electroluminescent material used is MEH-PPV (methoxy-ethylhexyloxy phenylenevinylene) known from the literature. A 0.75% solution of the polymer in chloroform is distributed on the polythiophene-coated substrate of Example 2C) for 10 seconds at 2000 r.p.m. using a coating centrifuge. Al point contacts are then applied to the polymer film of a thickness of 130 nm by vapour deposition.

E) Use of the Flexible Polymeric Luminescent Diodes

When the positive contact of a voltage source is connected to the PEDT layer and the negative contact with the Al, a current flows through the electroluminescent polymer. At the same time electroluminescence occurs. The luminescent intensity is proportional to the diode current and increases as the voltage increases.

What is claimed is:

1. A polymeric luminescent diode containing a charge-transporting intermediate layer comprising a mixture of:

(A) an aqueous solution comprising a water soluble polythiophene which is used in a cationic form with a polyanion, the polythiophene comprising a recurring structural unit of the formula (I):

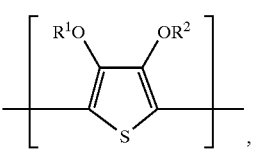

(I)

wherein $R_1$ and $R_2$, independently of one another, represent hydrogen or a $C_1$–$C_4$ alkyl group, or together form an optionally substituted $C_1$–$C_4$ radical or a cyclohexylene-1,2, radical, and (B) an organic compound of the formula (II):

   (II)

wherein
n and m, independently of one another, denote an integer from 1 to 20,
R represents a linear, branched or cyclic alkylene radical having 2 to 20 carbon atoms, an optionally substituted arylene radical having 6 to 14 carbon atoms, a pyran radical or a furan radical, and
X represents —OH or —NYZ, wherein Y and Z, independently of one another, represent hydrogen or alkyl, or
(B) is a sugar, a sugar derivative, ethylene glycol, glycerol, diethylene glycol or triethylene glycol.

2. The polymeric luminescent diode according to claim 1, wherein the charge-transporting intermediate layer is positioned between a transparent conductive electrode and an electroluminescent polymeric layer.

3. The polymeric luminescent diode according to claim 1, wherein the charge-transporting intermediate layer is positioned between an electroluminescent polymeric layer and a covering electrode.

4. The polymeric luminescent diode according to claim 1, wherein the charge-transporting intermediate layer has a thickness of about 3 to 200 nm.

5. The polymeric luminescent diode according to claim 4, wherein the thickness of the charge-transporting intermediate layer is about 10 to 100 nm.

6. The polymeric luminescent diode according to claim 5, wherein the thickness of the charge-transporting intermediate layer is about 10 nm.

7. The polymeric luminescent diode according to claim 1, wherein component (B) of the mixture comprises a compound selected from the group consisting of N-methylpyrrolidone, pyrrolidone, caprolactam, N-methycaprolactam, N-octylpyrrolidone, sucrose, glucose, fructose, lactose, a sugar alcohol, 2-furan carboxylic acid, 3-furan carboxylic acid, ethylene glycol, glycerol, diethylene glycol, and triethylene glycol.

8. The polymeric luminescent diode according to claim 7, wherein component (B) comprises N-methylpyrrolidone.

9. The polymeric luminescent diode according to claim 7, wherein component (B) comprises the sugar alcohol.

10. The polymeric luminescent diode according to claim 9, wherein the sugar alcohol is sorbitol or mannitol.

11. The polymeric luminescent diode according to claim 1, wherein the polyanion of the mixture comprises polystyrene sulfonic acid.

12. The polymeric luminescent diode according to claim 1, wherein the mixture contains 1 to 100,000 by weight of a compound of formula (II), based on the sum of the polythiophene cation and the polyanion.

13. The polymeric luminescent diode according to claim 12, wherein the mixture contains 10 to 1,0000% by weight of a compound of formula (II), based on the sum of the polythiophene cation and the polyanion.

14. The polymeric luminescent diode according to claim 1, wherein the mixture further comprises a water-miscible protic organic solvent.

15. A conductive coating comprising a mixture of:
(A) an aqueous solution comprising a water soluble polythiophene which is used in a cationic form with a polyanion, the polythiophene comprising a recurring structural unit of the formula (I):

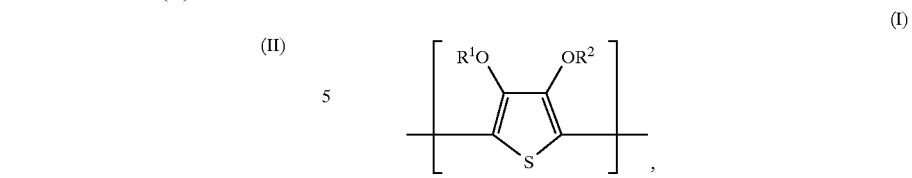

wherein
$R_1$ and $R_2$, independently of one another, represent hydrogen or a $C_1$–$C_4$ alkyl group, or together form an optionally substituted $C_1$–$C_4$ radical or a cyclohexylene-1,2, radical, and
(B) an organic compound of the formula (II):

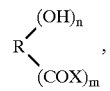   (II)

wherein
n and m, independently of one another, denote an integer from 1 to 20,
R represents a linear, branched or cyclic alkylene radical having 2 to 20 carbon atoms, an optionally substituted arylene radical having 6 to 14 carbon atoms, a pyran radical or a furan radical, and
X represents —OH or —NYZ, wherein Y and Z, independently of one another, represent hydrogen or alkyl, or
(B) is a sugar, a sugar derivative, ethylene glycol, glycerol, diethylene glycol or triethylene glycol.

16. The conductive coating according to claim 15, wherein the conductive coating is annealed.

17. The conductive coating according to claim 16, wherein the conductive coating is annealed at a temperature of from 100 to 400° C.

18. The conductive coating according to claim 15, wherein the conductive coating has a thickness of from 0.025 to 250 μm.

19. The conductive coating according to claim 15, wherein the conductive coating has a surface resistance of from about 0.1 to 2000 Ω/□.

20. An electroluminescent system comprising an upper electrode, a lower electrode, an electroluminescent layer therebetween, optionally an auxiliary layer therebetween, wherein the electroluminescent layer comprises a mixture of:
(A) an aqueous solution comprising a water soluble polythiophene which is used in a cationic form with a polyanion, the polythiophene comprising a recurring structural unit of the formula (I):

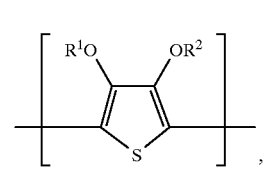

wherein
$R_1$ and $R_2$, independently of one another, represent hydrogen or a $C_1$–$C_4$ alkyl group, or together form an optionally substituted $C_1$–$C_4$ radical or a cyclohexylene-1,2, radical, and (B) an organic compound of the formula (II):

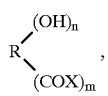
(II)

wherein n and m, independently of one another, denote an integer from 1 to 20,

R represents a linear, branched or cyclic alkylene radical having 2 to 20 carbon atoms, an optionally substituted arylene radical having 6 to 14 carbon atoms, a pyran radical or a furan radical, and X represents —OH or —NYZ, wherein Y and Z, independently of one another, represent hydrogen or alkyl, or (B) is a sugar, a sugar derivative, ethylene glycol, glycerol, diethylene glycol or triethylene glycol.

* * * * *